US006805746B2

(12) United States Patent
Moroishi et al.

(10) Patent No.: US 6,805,746 B2
(45) Date of Patent: Oct. 19, 2004

(54) METHOD FOR SUPPLYING CZ MATERIAL

(75) Inventors: Manabu Moroishi, Tokyo (JP); Kenichi Takenaka, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 34 days.

(21) Appl. No.: 10/188,368

(22) Filed: Jul. 3, 2002

(65) Prior Publication Data
US 2003/0041795 A1 Mar. 6, 2003

(30) Foreign Application Priority Data

Jul. 6, 2001 (JP) ........................................ 2001-206611

(51) Int. Cl.7 ............................................... C30B 15/02
(52) U.S. Cl. ...................... 117/214; 117/217; 117/73; 117/33
(58) Field of Search ................................ 117/214, 217, 117/33, 13

(56) References Cited

U.S. PATENT DOCUMENTS

| | | | | |
|---|---|---|---|---|
| 4,282,184 A | * | 8/1981 | Fiegl et al. ................. | 117/214 |
| 4,394,352 A | * | 7/1983 | Helda et al. ................. | 117/214 |
| 5,902,395 A | * | 5/1999 | Nagai et al. .................. | 117/33 |
| 5,919,303 A | * | 7/1999 | Holder ......................... | 117/33 |
| 6,007,621 A | * | 12/1999 | Yatsurugi .................... | 117/214 |

\* cited by examiner

*Primary Examiner*—Robert Kunemund
(74) *Attorney, Agent, or Firm*—Morrison & Foerster LLP

(57) ABSTRACT

Granules/lumps poly-silicon raw material, low in raw material cost and free of the hazard of crack is additionally charged into a crucible in a safe and steady manner. In a single crystal growth according to the CZ method, poly-silicon raw material ins initially charged into a crucible. Above the initially charged poly-silicon raw material, a heat resistant tubular container is placed. The granules/lumps poly-silicon raw material for use in additional charging is charged inot the tubular container. The poly-silicon raw material initially charged into the crucible is melted. The poly-silicon raw material in the tubular container gradually and spontaneously comes down into the crucible, as the bulk of poly-silicon raw material is decreased according to the melting of the initially charged raw material.

4 Claims, 3 Drawing Sheets

METHOD FOR SUPPLYING CZ MATERIAL

BACKGROUND OF THE INVENTION

1. Field of the Invention

The present invention relates to a method for supplying CZ raw material which is used in forming the raw material melt in a single crystal growth according to the CZ method, and in particular to a method for supplying CZ raw material for use in additional charging of poly-silicon raw material.

2. Description of the Related Art

As is well known, in the single crystal growth according to the CZ method, the solid poly-silicon raw material initially charged into a crucible is melted by heating with a heater. Once the raw material melt is thus formed in the crucible, a seed crystal is immersed into the raw material melt in the crucible, and then a cylindrical single crystal is grown under the seed crystal by pulling the seed crystal while the seed crystal and the crucible are rotated. Poly-silicon cut rods, chunks, grains, and the like are used independently or in combinations thereof as solid poly-silicon raw material to be charged into the crucible initially.

In such single crystal growth, when the solid raw material initially charged into the crucible is melted, the bulk is decreased and the volume of the raw material melt is decreased compared to the crucible volume, unavoidably leading to a decrease of the productivity. In order to avoid this fault, the amount of the raw material to be charged into the crucible is considered to be increased, and as such a remedy there has been developed a technique referred to as additional charge.

In the additional charge, after the solid raw material initially charged into the crucible has been melted, solid poly-silicon raw material is charged additionally into the raw material melt in the crucible. As such a mode of raw material charging, there is a technique wherein a cylindrical mass of poly-silicon raw material, hung over the crucible with a wire to be used for crystal pulling, is gradually lowered and immersed into the raw material melt in the crucible. Accordingly, the volume of the raw material melt in the crucible is increased, and the volume of the crucible is effectively utilized, improving the productivity.

SUMMARY OF THE INVENTION

In such prior additional charge techniques, however, while a cylindrical mass of poly-silicon raw material is immersed in the raw material melt in the crucible, an axial and a radial thermal strain are caused to occur in the poly-silicon raw material, and thereby cracks are generated during the immersing. As a result, rupture takes place frequently in the axially intermediate portion, and at a time a large amount of poly-silicon raw material drops into the raw material melt in the crucible. When such dropping occurs, the crucible may be broken and there may be a high possibility of the melt run-out hazard that a large amount of the raw material melt flows into the furnace.

In another additional charge technique, by use of a raw material supplying pipe inserted into the furnace, granules/lumps poly-silicon raw material is dropped into the raw material melt in the crucible; when the raw material is dropped in, there may occur troubles such as the splashing of the melt droplets, the bouncing of the raw material itself, and furthermore the damaging of the crucible caused by the collision of the raw material being dropped in, and the like. Incidentally, as for the raw material, the cost of granules/lumps raw material is lower than that of cylindrical mass of raw material.

The object of the present invention is to provide a method for supplying CZ raw material which method allows additional charging of granules/lumps poly-silicon raw material, low in raw material cost and unsusceptible to crack, into a crucible in a static and steady manner.

In order to achieve the above-mentioned object in growing single crystals according to the CZ method, in the method for supplying CZ raw material of the present invention, a tubular container charged with lumps and/or granules poly-silicon raw material is placed above the poly-silicon raw material initially charged into the crucible, and the poly-silicon raw material in the tubular container is additionally fed to the crucible as the melting of the poly-silicon raw material in the crucible proceeds.

According to the present invention, as the bulk of poly-silicon raw material in the crucible is decreased in parallel with the melting of the poly-silicon raw material in the crucible, the poly-silicon raw material in the tubular container gradually and spontaneously descends by its own weight to get into the crucible. Thus, the poly-silicon granules/lumps raw material unsusceptible to crack is additionally charged into the crucible in a static and steady manner without being accompanied by the splashing of the melt as well as the bouncing of the raw material.

The tubular container is made of a heat-resistant material, which material preferably comprises particularly carbon unsusceptible to heavy-metal contamination, carbon material at least with its interior surface coated with SiC, or SiC. Only with carbon, while the poly-silicon raw material in the tubular container moves downward, the interior surface of the tubular container may possibly be scraped off, resulting in contamination of the melt with carbon, whereas the SiC coating prevents such possible contamination.

Preferably, the tubular container has such a partitioned structure that the tubular container can be partitioned circumferentially into a plurality of parts, and the parts are combined so as to be movable outward. Thus, the container can radially expand according to the thermal expansion of the poly-silicon raw material in the container, so that the clogging of the poly-silicon raw material is prevented effectively.

DETAILED DESCRIPTION OF THE PREFERRED EMBODIMENT

Figure 1:
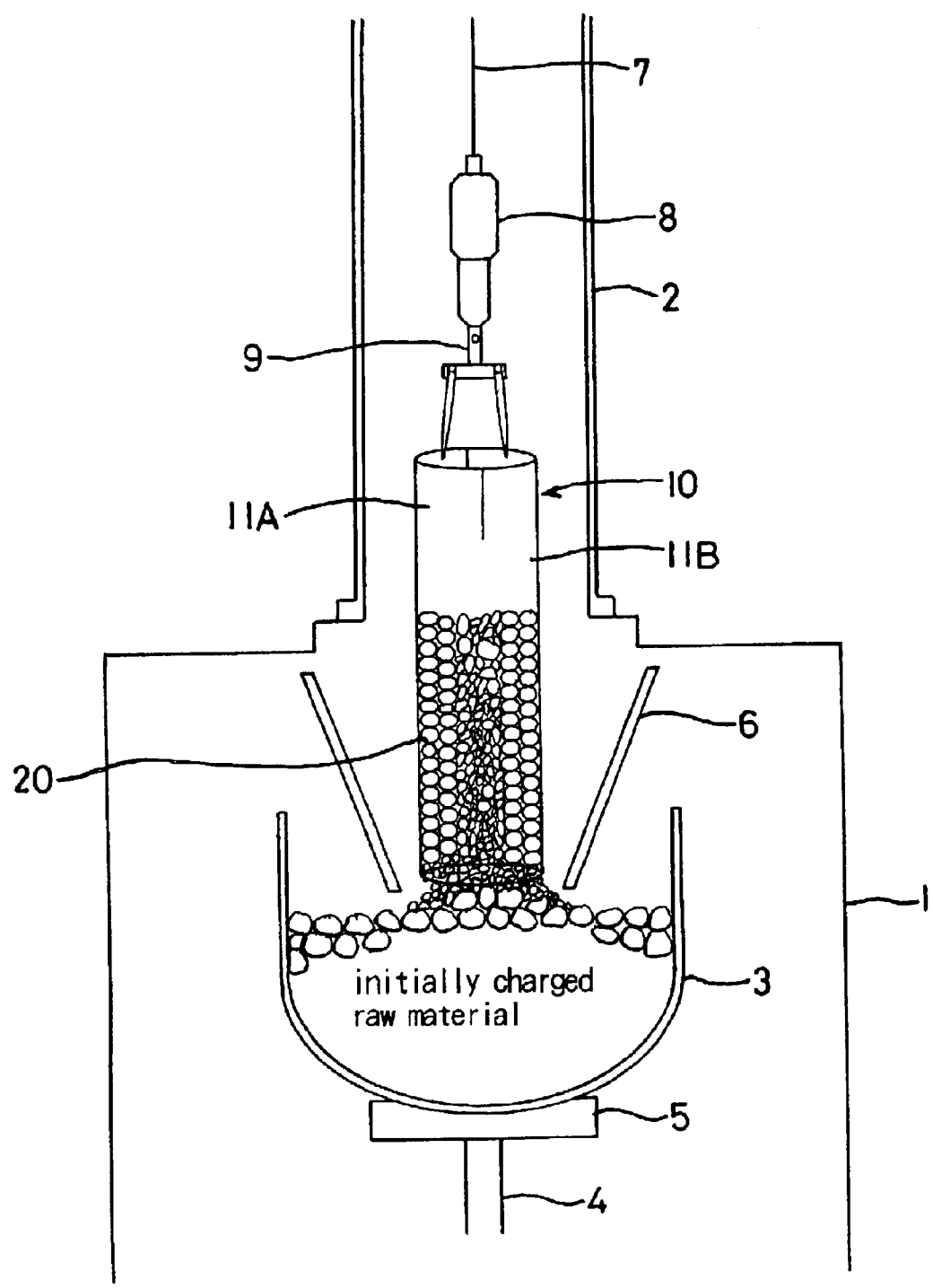
FIG. 1 is a schematic view of a method for supplying CZ raw material to illustrate an embodiment of the present invention.
Figure 2:
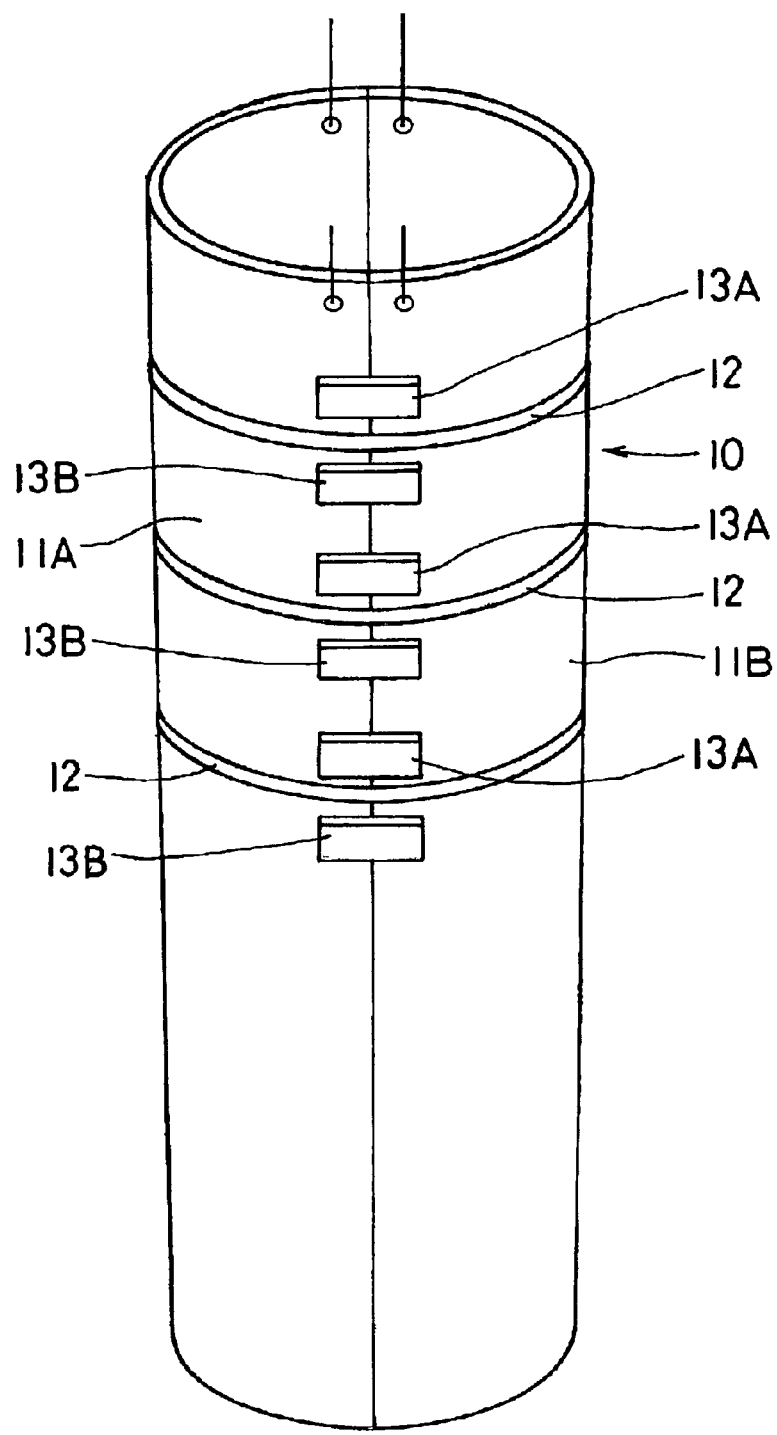
FIG. 2 is a perspective view of a tubular container which is used in the method for supplying CZ raw material.
Figure 3:
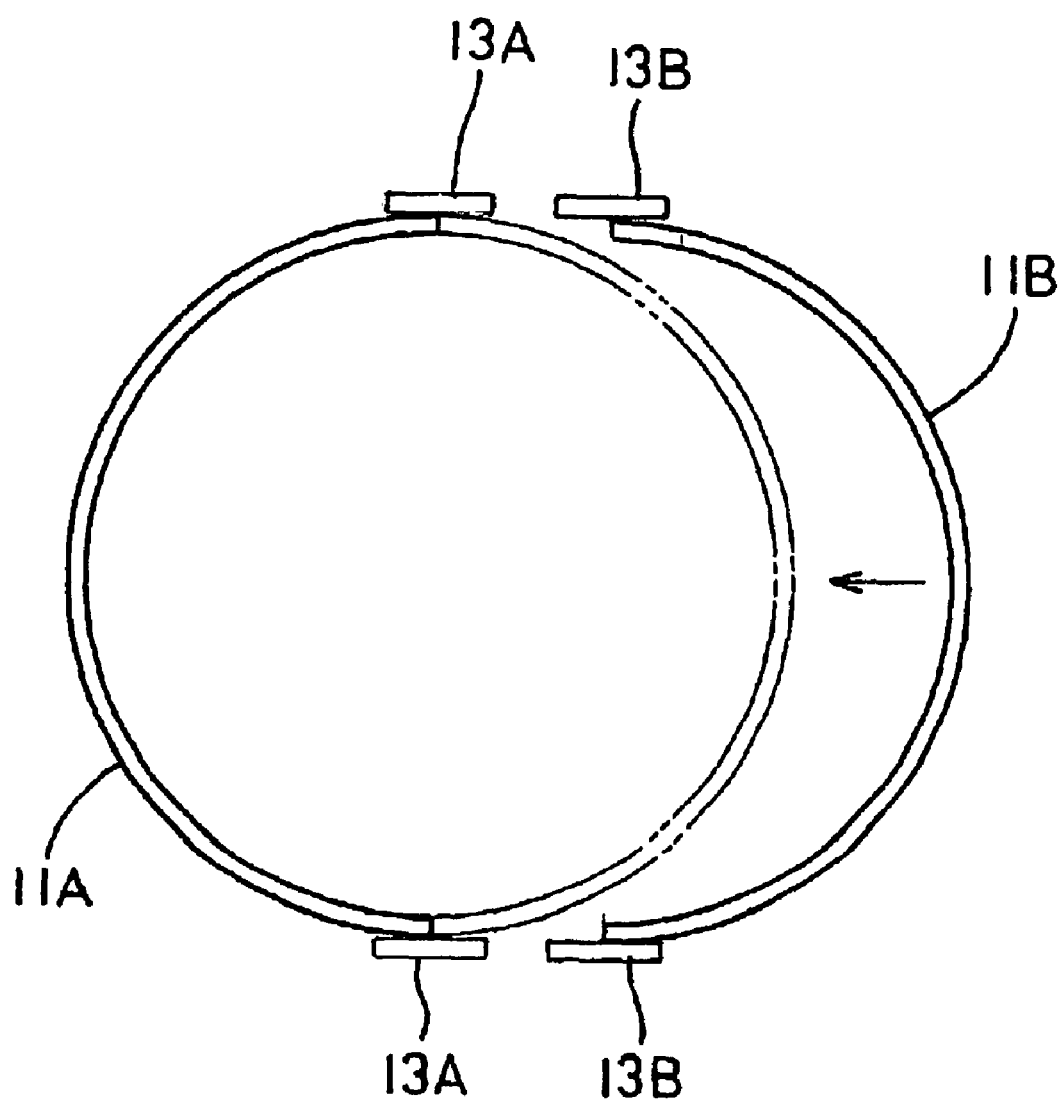
FIG. 3 is a plan view of the tubular container.

Referring to the drawings, an embodiment of the present invention will now be described in detail. FIG. 1 is a schematic view for a method for supplying CZ raw material to illustrate an embodiment of the present invention, FIG. 2 is a perspective view of a tubular container used in the method for supplying CZ raw material, and FIG. 3 is a plan view of the tubular container.

In the present embodiment, silicon single crystals are produced according to the CZ method. The CZ furnace used in the single crystal production comprises, as shown in FIG. 1, a main chamber 1 as a furnace body and a pull chamber 2. The pull chamber 2 is smaller in diameter than the main chamber 1, and placed above the central portion of the main chamber 1.

A crucible 3 and a heat shield 6 are arranged in the central portion of the interior of the main chamber 1. The crucible 3 is of the double structure composed of an inner quartz crucible and an outer graphite crucible, and is supported with a supporting shaft 4 referred to as a pedestal through the intermediary of the crucible support 5. The supporting shaft 4 drives the crucible 3 axially and circumferentially. The heat shield 6 is a cylinder with its diameter gradually increasing upward, and surrounds a single crystal being pulled from the raw material melt in the crucible 3 so as to accelerate the cooling of the single crystal.

The pull chamber 2 is driven up and down axially, and is rotated horizontally. In the pull chamber 2, a wire 7 as a pulling axis is hung for pulling a single crystal, and a seed chuck 8 is fixed to the tail end of the wire 7. The wire 7 is driven to rotate as well as to move up and down by a driving mechanism placed at the uppermost portion of the pull chamber 2. A cyclic heater, which is not explicitly shown, is arranged around the outside of the crucible 3, and in a further outer location, a heat insulator is fixed on the inner surface of the main chamber 1.

In the method for supplying CZ raw material of the present embodiment, at the beginning, a prescribed amount of poly-silicon raw material is initially charged into the crucible 3. Alternatively, the crucible 3 initially charged with a prescribed amount of poly-silicon raw material is set in the main chamber 1. Then, while the pull chamber 2 is moved to be placed near the side of the main chamber 1, the tubular container 10 is hung on the tail end of the wire 7, and is arranged above the initially charged raw material in the crucible 3 by handling the pull chamber 2 and the wire 7.

The tubular container 10 is a cylinder having a smaller diameter than that of the crucible 3. The cylinder is made of a heat-resistant material, such as carbon unsusceptible to heavy-metal contamination, SiC or the like, and is bisected into the two arc-shaped members 11A, 11B, each member having a circumferentially semicircular section. As FIG. 2 and FIG. 3 show, the two arc-shaped members 11A, 11B are assembled into a cylindrical form, and fixed with the bands 12 at a plurality of locations along the axial direction. To prevent the displacement of the arc-shaped members 11A, 11B, the positioning members 13A, 13B are set on both edges of each of the arc-shaped members 11A, 11B.

The arc-shaped members 11A, 11B combined into a cylindrical form, that is, the tubular container 10 is at first hung, near the side of the main chamber 1, with a wire on the inverted T-shaped supporting member 9 held tight by the seed chuck 8. Then, the container 10, together with the pull chamber 2, is moved and placed above the main chamber 1, to be arranged concentrically above the initially charged raw material in the crucible 3, in a state of contact with or with a small clearance from the initially charged raw material.

On completion of thus setting the tubular container 10 above the initially charged raw material, the tubular container 10 in a supported state is exposed at a lower level than the bottom portion of the pull chamber 2, by moving the pull chamber 2 upward while the wire 7 is pulled downward. And by using flexible guide sleeves or the like, the poly-silicon raw material 20 for use in additional charging is charged into the tubular container 10. As the poly-silicon raw material 20, lumps raw material referred to as lump or granules/lumps raw material referred to as chip, or both thereof are used.

Incidentally, the lump is lumps raw material having a diameter of the order of 40 to 80 mm, while the chip is granules/lumps raw material having a diameter of the order of 5 to 40 mm.

The poly-silicon raw material 20 charged into the tubular container 10 is supported at the bottom by the raw material initially charged into the crucible 3, so as to be kept in the tubular container 10. On completion of charging the raw material into the tubular container 10, with the tubular container 10 in a supported state, the pull chamber 2 is combined with the main chamber 1, by moving the pull chamber 2 downward while the wire 7 is wound up. Thereafter, by way of the prearranged procedures, the initially charged raw material in the crucible 3 is melted.

When the initially charged raw material in the crucible 3 starts to be melted, the bulk of poly-silicon raw material in the crucible 3 is decreased. Therewith the poly-silicon raw material 20 in the tubular container 10 for use in additional charging gradually moves downward, and is fed successively to the crucible 3. Although optionally either the tubular container 10 may be moved upward or the crucible 3 may be moved downward in order to accelerate the discharge of the raw material from the tubular container 10, it is preferred to move the crucible 3 downward, since there is an apprehension that the metal contamination will occur through the contact of the poly-silicon raw material 20 in the tubular container 10 for use in additional charging with the bottom portion of the heat shield 6 when the tubular container 10 is moved upward in excess.

In this occasion, since the poly-silicon raw material 20 in the tubular container 10 for use in additional charging is heated by the radiation heat produced by the heating of the raw material in the crucible 3, there is an apprehension that it will be thermally expanded to form a bridge state in the tubular container 10 and to remain within the tubular container 10 even when the initially charged raw material in the crucible 3 sinks. In the present embodiment, however, the tubular container 10 is bisected into the two arc-shaped members 11A, 11B, which are fixed by the bands 12 at a plurality of locations along the axial direction, so that the arc-shaped members 11A, 11B are displaced outward with the thermal expansion of the poly-silicon raw material 20. Owing to this radial expansion, there is circumvented the poor downward movement of the poly-silicon raw material 20 to be caused by its thermal expansion.

Furthermore, in the present embodiment, the arc-shaped members 11A, 11B are fixed with bands 12 in their upper portions, and hence extended wider in a tapered shape on going down to the lower portions, thereby improving the discharge performance of the raw material from the inside of the tubular container 10. As for this discharge performance, chips are better than lumps.

Thus, the granules/lumps poly-silicon raw material 20, which is low in raw material cost, and moreover free of the hazard of crack, is charged additionally into the crucible 3, without the splashing of the melt droplets as well as the bouncing of the dropped-in raw material, and furthermore without the damaging of the crucible caused by the collision of the raw material being dropped in. Owing to the additional charging, a large amount of raw material melt is formed in the crucible 3.

On completion of the additional charging, the pull chamber 2 and the wire 7 are operated to remove the tubular container 10 to the outside of the pull chamber 2, and the seed crystal is fixed to the seed chuck 8. Thereafter, the pull chamber 2 is again combined with the main chamber 1 to start the operation of single-crystal pulling.

EXAMPLES

The results of the embodiment of the present invention will be described below.

In the growth of a silicon single crystal with a diameter of 5 inches by use of a quartz crucible with a diameter of 18 inches, the charging of the raw material was performed according to the above-described method. In particular, there was initially charged 40 kg of lumps in the quartz crucible. And, 20 kg of lumps were additionally charged into the quartz crucible by use of a tubular container. As the tubular container, a bisected SiC tube was used.

In the additional charging, the total amount of lumps charged into the tubular container was put into the quartz crucible smoothly. Consequently, as compared to the case of additional charging of cylindrical mass of poly-silicon raw material, the hazard of the raw material drop accident caused by crack generation was avoided and the security was remarkably improved. In addition, the raw material cost was reduced by 5%, and a further reduction of the raw material cost may be achieved by increasing the additionally charged amount. Furthermore, the time for melting was also reduced by 2 hours.

Although the reason for the reduced melting time is not known exactly, the following facts probably seem to affect the melting time; even with the same amount of additional charge, the surface area of the lump raw material is larger than that of the cylindrical mass of poly-silicon raw material; the upper surface portion of the lump raw material initially charged into the crucible is covered with the tubular container charged with the raw material for use in additional charging, so that the heat liberation from the upper surface portion of the lump raw material in the crucible to the upper portion of the chamber is suppressed, accordingly enhancing the heat-retention effect in the crucible; and so forth.

In addition, the size of the tubular container used in the present invention is 170 mm in outside diameter, 4 mm in thickness, and 1200 mm in length, but the size of the tubular container is not necessarily restricted to this size, and may appropriately be determined according to the size of the apparatus used for single-crystal pulling; particularly, it may be determined according to the inside diameter of the pull chamber, the inside diameter of the heat shield, and the amount of charge inclusive of the crucible volume. The shape of the tubular container is also not restricted to a cylindrical shape, but any arbitrary shape of container is acceptable as far as essentially the container can take granules/lumps raw material in its inside, and either its top and bottom ends are open or at least the bottom end is open.

As described above, in the method for supplying CZ raw material of the present invention in the single crystal growth according to the CZ method, by additionally charging the poly-silicon raw material contained in the tubular container into the crucible, which container is charged in its inside with lumps and/or granules poly-silicon raw material and is placed above the poly-silicon raw material initially charged into the crucible, as the melting of the poly-silicon raw material in the crucible proceeds, the granules/lumps poly-silicon raw material, lower in raw material cost as compared to the cylindrical mass of poly-silicon raw material and free of the hazard of crack, can additionally be charged into the crucible, without the splashing of the melt droplets as well as the bouncing of the charged raw material, and furthermore without damaging the crucible by collision of the raw material being charged.

What is claimed is:

1. A method for supplying CZ raw material in growing single crystals according to the CZ method wherein poly-silicon raw material in a tubular container is additionally fed to a crucible as the melting of the poly-silicon raw material in the crucible proceeds, the tubular container being charged with lumps and/or granules poly-silicon raw material and placed above the poly-silicon raw material initially charged into the crucible in a chamber, the poly-crystal raw material in the tubular container being supported at the bottom by the poly-crystal raw material initially charged into the crucible, and the poly-crystal raw material in the crucible being melted in this state.

2. The method for supplying CZ raw material according to claim 1, wherein the poly-silicon raw material in the tubular container is lowered gradually into the crucible according to the decrease of the bulk of poly-silicon raw material in the crucible caused by the melting of the raw material.

3. The method for supplying CZ raw material according to claim 1, wherein the tubular container is made of carbon, carbon at least with the interior surface coated with SiC, or SiC.

4. The method for supplying CZ raw material according to claim 1, wherein the tubular container has such a partitioned structure that the tubular container is partitioned circumferentially into a plurality of parts, and the parts are combined so as to be movable outward.

* * * * *